United States Patent
Bowen et al.

(10) Patent No.: US 7,268,399 B2
(45) Date of Patent: Sep. 11, 2007

(54) ENHANCED PMOS VIA TRANSVERSE STRESS

(75) Inventors: Robert C. Bowen, Lucas, TX (US); Yuguo Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/930,638

(22) Filed: Aug. 31, 2004

(65) Prior Publication Data

US 2006/0043424 A1 Mar. 2, 2006

(51) Int. Cl.
*H01L 29/78* (2006.01)

(52) U.S. Cl. ............ 257/369; 257/255; 257/E29.02; 257/E29.255; 438/198; 438/221

(58) Field of Classification Search ........ 438/198, 438/221, 296, 424; 257/255, 369, E29.02, 257/E29.255
See application file for complete search history.

(56) References Cited

U.S. PATENT DOCUMENTS

| | | | | |
|---|---|---|---|---|
| 5,970,330 A | * | 10/1999 | Buynoski | 438/198 |
| 6,211,064 B1 | * | 4/2001 | Lee | 438/626 |
| 6,657,276 B1 | * | 12/2003 | Karlsson et al. | 257/510 |
| 6,870,179 B2 | * | 3/2005 | Shaheed et al. | 257/29 |
| 6,876,053 B1 | * | 4/2005 | Ma et al. | 257/500 |
| 6,884,667 B1 | * | 4/2005 | Doris et al. | 438/164 |
| 6,974,738 B2 | * | 12/2005 | Hareland et al. | 438/199 |
| 7,001,844 B2 | * | 2/2006 | Chakravarti et al. | 438/680 |
| 2002/0063292 A1 | | 5/2002 | Armstrong et al. | |
| 2004/0113174 A1 | * | 6/2004 | Chidambarrao et al. | 257/200 |
| 2005/0093078 A1 | * | 5/2005 | Chan et al. | 257/374 |
| 2005/0184345 A1 | * | 8/2005 | Lin et al. | 257/375 |
| 2005/0224798 A1 | * | 10/2005 | Buss | 257/65 |
| 2005/0255667 A1 | * | 11/2005 | Arghavani et al. | 438/405 |
| 2006/0043500 A1 | * | 3/2006 | Chen et al. | 257/401 |
| 2006/0043579 A1 | * | 3/2006 | He et al. | 257/712 |

OTHER PUBLICATIONS

S. Wolf, "Silicon Processing for the VLSI Era: Process Technology," vol. 1, 1986, pp. 1-6.*

* cited by examiner

*Primary Examiner*—Chandra Chaudhari
*Assistant Examiner*—Steven J. Fulk
(74) *Attorney, Agent, or Firm*—Peter K. McLarty; W. James Brady, III; Frederick J. Telecky, Jr.

(57) ABSTRACT

In the present invention, a PMOS device comprises a channel region formed in {100} silicon with first and second source/drain region disposed on either side of the channel region. The channel region is oriented such that a current flow between the source/drain regions has a <100> direction through the channel region. Dielectric regions create a compressive stress on the channel region perpendicular to the current flow.

10 Claims, 2 Drawing Sheets

ENHANCED PMOS VIA TRANSVERSE STRESS

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to integrated circuits and, more particularly, to transistor structures.

2. Description of the Related Art

The great majority of electronic circuits used today are fabricated using a CMOS (complementary metal oxide semiconductor) process. There are two types of CMOS devices, N-type devices (NMOS) and P-type (PMOS) devices. An N-type device is turned on or off by the movement of electrons through an n-type doped channel. A P-type device is turned on or off by the movement of holes (electron vacancies) through a p-type doped channel.

The speed of a CMOS circuit depends largely upon the speed of the CMOS transistors. There is always pressure to increase the speed of the transistors to increase the processing capacity of a circuit. While much of the increases in speed over the last decade have been the result of smaller channel sizes, further increases in speed by reducing feature size will be more and more difficult to obtain.

For many years, it has been known that applying stress to a semiconductor material can change the mobility of electrons or holes in the doped regions. The effect of stress is dependent upon the lattice structure of the semiconductor material, the orientation of the channels on the semiconductor material, the type of stress (i.e., tensile or compressive), and the direction of the stress.

In U.S. Ser. No. 09/727,296 (Pub. No. U.S. 2002/0063292), which is incorporated by reference herein, a method of forming CMOS devices so that current flows along a <100> direction in {100} silicon while applying a tensile longitudinal stress to the CMOS device. According to this reference, this technique increases electron mobility in the NMOS devices, while have a negligible effect on the PMOS devices.

In general, even in the absence of any stress, NMOS devices are significantly faster than PMOS devices in a given processing technology. Therefore, a need has arisen for a process which increases the speed of PMOS devices.

BRIEF SUMMARY OF THE INVENTION

In the present invention, a PMOS device comprises a channel region formed in {100} silicon with first and second source/drain region disposed on either side of the channel region. The channel region is oriented such that a current flow between the source/drain regions has a <100> direction through the channel region. Dielectric regions create a compressive stress on the channel region perpendicular to the current flow.

The present invention provides a significant advantage over the prior art. By aligning the PMOS transistors with the current path in the <100> direction, hole mobility is greatly increased. Electron mobility in NMOS transistors similarly oriented does not show significant degradation.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 2b illustrates a top view of CMOS device of the type shown in FIG. 2a;

DETAILED DESCRIPTION OF THE INVENTION

The present invention is best understood in relation to FIGS. 1-3a-b of the drawings, like numerals being used for like elements of the various drawings.

Figure 1:
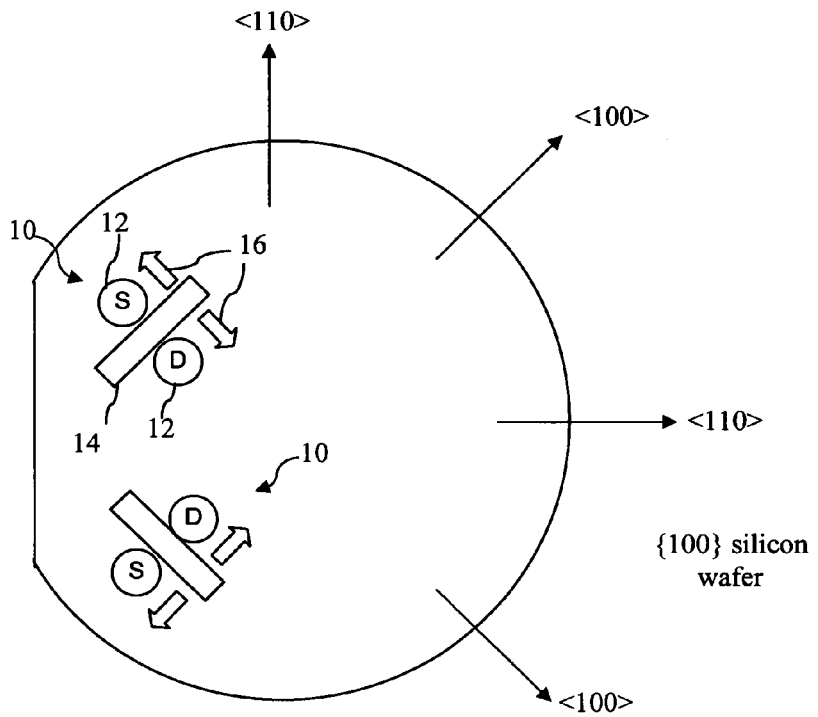
FIG. 1 illustrates a {100} silicon wafer with a CMOS device oriented in the <100> direction with longitudinal tensile stress applied to the channel region as described in Pub. No. U.S. 2002/0063292.

FIG. 1 illustrates a {100} silicon wafer with a CMOS device oriented in the <100> direction with longitudinal tensile stress applied to the channel region as described in Pub. No. U.S. 2002/0063292. In this embodiment, transistors 10 are formed with source/drain regions 12 adjacent to channel 14. The current flow between source/drain regions 12 will be in the <100> direction. A longitudinal tensile stress, shown by arrows 16, is applied to the channel 14.

It is claimed that when a longitudinal tensile stress is applied to an n-type region of a {100} semiconductor wafer, the piezoresistive coefficient is at a minimum (approximately −100 units) in the <100> direction. When the same longitudinal tensile stress is applied to a p-type region of the semiconductor wafer, the piezoresistive coefficient is only slightly above the neutral condition. Accordingly, it is claimed that if transistors are aligned such that current flows in the <100> direction and longitudinal tensile stress is applied to the channels in the <100> direction, then the resulting NMOS transistors will have an increase in speed without affecting the performance of the PMOS transistors.

Tests have shown that the improvement will not be as great as expected in the NMOS transistors as would be indicated by the piezocoefficients; further, to the extent that an improvements exists, the speed difference between the NMOS and PMOS transistors will be increased even more.

Figure 2A:
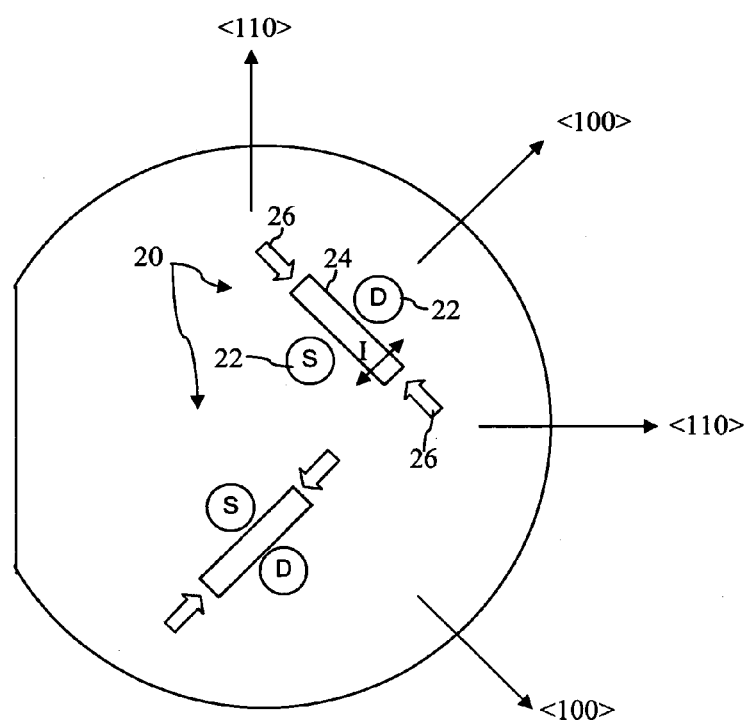
FIG. 2a illustrates a {100} silicon wafer with a greatly enlarged CMOS device oriented in the <100> direction with transverse compressive stress applied to the channel region.

FIG. 2a illustrates a {100} silicon wafer with (greatly enlarged) CMOS devices oriented in the <100> direction with transverse compressive stress applied to the channel region. In this embodiment, transistors 20 are formed with source/drain regions 22 adjacent to the channel 24. The current flow between source/drain regions 22 will be in the <10022 direction. A transverse compressive stress, shown by arrows 26, is applied to the channel 24. The transverse compressive stress compresses the channel in a direction perpendicular to the current flow through the channel.

Figure 2B:
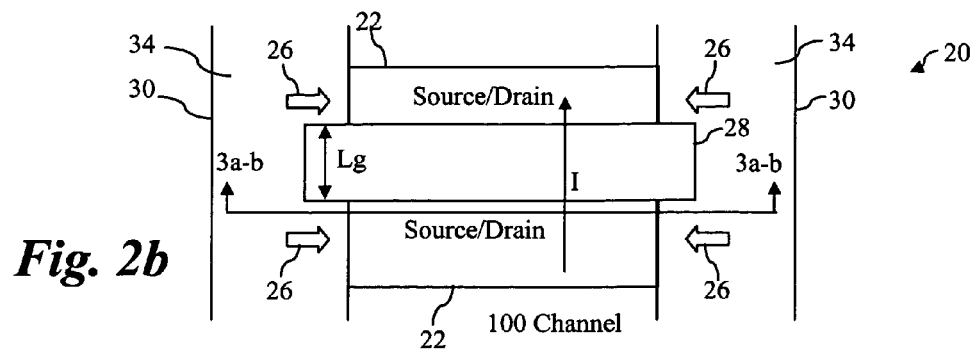

FIG. 2b illustrates a top view of a transistor 20. Gate 28 is formed over channel 24 and source/drain regions lie adjacent to gate 28. Trenches 30 are formed on either side of the channel 24. The transverse compressive stress can be created by filling the trenches 30 with a dielectric 34, such as a grown oxide.

Table 1 demonstrates the improvements in PMOS transistors oriented in the <100> direction with transverse compressive stress applied to the channels compared to transistors with longitudinal tensile stress.

TABLE 1

ΔIdsat/Idsat and ΔGm/Gm Changes

|      |              | <100> Channel |         |           |           | <110> Channel |         |           |           |
|------|--------------|---------------|---------|-----------|-----------|---------------|---------|-----------|-----------|
|      |              | Idsat %       | Gm %    | Piezo %   | nwell %   | Idsat %       | Gm %    | Piezo %   | nwell %   |
|      |              | Lg = 10 μm    |         | —         | —         | Lg = 10 μm    |         | —         | —         |
| NMOS | Longitudinal | 4.8           | 5.6     | 10.0      | 10.2      | 3.4           | 3.5     | 3.1       | 3.2       |
| NMOS | Transverse   | 1.2           | 1.2     | −5.3      | −5.4      | 1.2           | 1.4     | 1.8       | 1.8       |
| PMOS | Longitudinal | 0             | 0       | −0.7      | —         | −7.5          | −7.5    | −7.2      | —         |
| PMOS | Transverse   | −2.6          | −2.7    | 0.1       | —         | 6.8           | 6.9     | 6.6       | —         |
|      |              | Lg = 40 nm    |         |           |           | Lg = 40 nm    |         |           |           |
| NMOS | Longitudinal | 1.7           | 1.7     |           |           | 1.6           | 2.1     |           |           |
| NMOS | Transverse   | 0.4           | 0.8     |           |           | 0.5           | 0.6     |           |           |
| PMOS | Longitudinal | 0             | 0       |           |           | −2.7          | −4.9    |           |           |
| PMOS | Transverse   | −1.1          | −2      |           |           | 2.3           | 3.4     |           |           |

Table 1 shows the changes, ΔIdsat/Idsat and ΔGm/Gm, by 100 MPa tensile stress for transistors with gate length of 40 nm and 10 μm. It should be noted that the sign of the measurements changes for compressive stress. The standard deviation of the measured ΔIdsat/Idsat is about 0.2%, and that of Gm is about 0.4%. The predicted changes by piezoresistance coefficients can be compared with the measured changes in 10 μm MOSFETs. There are obvious differences between the piezoresistance coefficients and the measured changes in Gm and drive currents in both n- and p-MOSFETs. To further validate the measurements, the built-in n-well resistors were measured simultaneously on the chips. The changes in conductance agree very well with piezoresistance coefficients, as listed in Table 1. The consistency between nwell resistors and piezoresistance coefficients and their disagreements with MOSFETs suggest that it is not possible to use the piezoresistance coefficients to predict the changes in drive currents of <100> MOSFETs even if the Lg dependence is taken into account. Table 1 also lists the changes, ΔIdsat/Idsat and ΔGm/Gm, of <110> channel transistors by 100 MPa tensile stress on the right side of the table for comparison. In this case, piezoresistance coefficients agree with the measured Gm and drive current changes in long-channel MOSFETs.

As can be seen from Table 1, for a PMOS transistor with a transverse 100 MPa compressive stress, a 10 μm gate length, an improvement of about 2.6% in current can be achieved, while the current of an NMOS transistor is decreased by only about 1.2%. For a 40 nm gate length, the PMOS transistor current increases by about 1.1%, while the NMOS current decreases by only 0.4%.

Figure 3A:
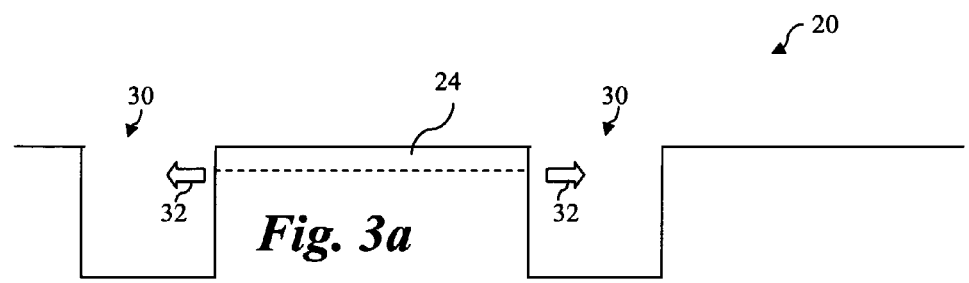
FIGS. 3a through 3b illustrate a process flow for producing the transistors of FIGS. 2a-b.
Figure 3B:
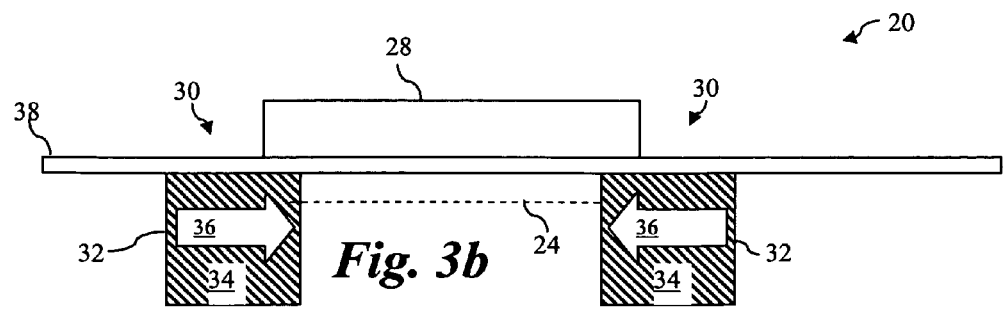

FIGS. 3a-b illustrate a cross-sectional side view of a transistor 20 showing a simplified process for creating the compressive force on the channel 24. In FIG. 2a, the trenches 30 are formed on either side of the channel 24 using a trench etch process. At the time of etching the trenches, the substrate including the channel 24 will expand slightly, creating a slightly tensile force on the channel 24, as shown by arrows 32.

In FIG. 3b, the trenches are filled with dielectric 34. Typically, this is accomplished through an oxide growth in the trenches. The fill process is performed so as to create a transverse stress, as shown by arrows 36. The amount of compressive stress can be varied by controlling the film composition in the fill process. The trench fill is followed by formation of the gate oxide 38, gate deposition and etch, and gate sidewall (not shown) deposition and etch. The gate sidewalls can also be used to create compressive stress.

The present invention provides a significant advantage over the prior art. A faster PMOS transistor can be achieved with little affect on NMOS transistors in the same circuit. The speed gap between NMOS and PMOS transistors is thus narrowed.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

The invention claimed is:

1. A PMOS device, comprising:
   a channel region formed in {100} silicon;
   first and second source/drain regions disposed on either side of the channel region, such that a current flow between the source/drain regions has a <100> direction through the channel region;
   trenches formed in the silicon on opposing ends of the channel region; and
   dielectric regions formed within the trenches for creating a compressive stress on the channel region perpendicular to the current flow.

2. The PMOS device of claim 1 and further comprising a gate disposed above the channel region.

3. The PMOS device of claim 1 wherein the dielectric regions comprise oxide regions.

4. An integrated circuit comprising:
   a {100} silicon substrate;
   a plurality of PMOS devices each comprising:
      a channel region formed in {100} silicon;
      first and second source/drain regions disposed on either side of the channel region, such that a current flow between the source/drain regions has a <100> direction through the channel region; and
      dielectric regions forming a compressive stress on the channel region perpendicular to the current flow; and
   a plurality of NMOS devices each comprising:

a channel region formed in {100} silicon;

first and second source/drain regions disposed in either side of the channel region, such that a current flow between the source/drain regions has a <100> direction through the channel region; and dielectric regions creating a lateral compressive stress on the channel region perpendicular to the current flow.

5. The integrated circuit of claim 4 and further comprising gates disposed above each of the channel regions.

6. The PMOS device of claim 4 wherein the dielectric regions comprise oxide regions.

7. The PMOS device of claim 1 wherein the compressive stress is about 100 MPa.

8. The PMOS device of claim 1 wherein the compressive stress is controlled with a film composition of the dielectric.

9. The integrated circuit of claim 4 wherein the compressive stress is about 100 MPa.

10. The integrated circuit of claim 4 wherein the compressive stress is controlled with a film composition of the dielectric.

* * * * *